United States Patent
Beratan et al.

(10) Patent No.: US 6,245,591 B1
(45) Date of Patent: Jun. 12, 2001

(54) HIGH MTF OPTICAL COATING FOR HYBRID UFPA'S

(75) Inventors: Howard R. Beratan; Chih-Chen Cho, both of Richardson, TX (US)

(73) Assignee: Texas Instruments Incorporated, Dallas, TX (US)

(*) Notice: Subject to any disclaimer, the term of this patent is extended or adjusted under 35 U.S.C. 154(b) by 942 days.

(21) Appl. No.: 08/788,313

(22) Filed: Jan. 24, 1997

Related U.S. Application Data

(63) Continuation of application No. 08/431,250, filed on Apr. 28, 1995, now abandoned.

(51) Int. Cl.[7] .................................................. H01L 21/00
(52) U.S. Cl. ............................ 438/55; 438/65; 438/69; 438/72; 438/73
(58) Field of Search ................................ 437/3, 187, 215, 437/235, 915; 250/332, 338, 3

(56) References Cited

U.S. PATENT DOCUMENTS

| | | | |
|---|---|---|---|
| 4,994,672 | * 2/1991 | Cross et al. | 250/330 |
| 5,093,735 | * 3/1992 | Doane et al. | 359/52 |
| 5,424,544 | * 6/1995 | Shelton et al. | 250/332 |
| 5,457,318 | * 10/1995 | Robinson et al. | 250/332 |
| 5,461,003 | * 10/1995 | Havemann et al. | 437/187 |
| 5,470,802 | * 11/1995 | Gnade et al. | 437/238 |
| 5,476,817 | * 12/1995 | Numata | 437/195 |

OTHER PUBLICATIONS

Hrubesh, Lawrence W. et al., Processing and Characterization of High Porosity Aerogel Films, Advances in Porous Materials Materials Research Society Symposium Proceedings v 371. Materials Research Society, p. 195–204. (best date available), 1995.*

Hrubesh, Lawrence W. et al., Processing and Characterization of High Porosity Aerogel Films, (only abstract availabel) UCRL-JC-117554; CONF-941144-176, Nov. 1994.*

* cited by examiner

*Primary Examiner*—David E. Graybill
(74) *Attorney, Agent, or Firm*—Wade James Brady, III; Frederick J. Telecky, Jr.

(57) ABSTRACT

An optical coating for an uncooled focal plane array detector where the optical coating comprises a porous film. The porous film preferably comprises a xerogel.

15 Claims, 2 Drawing Sheets

HIGH MTF OPTICAL COATING FOR HYBRID UFPA'S

This application is a continuation of application Ser. No. 08/431,250, filed Apr. 28, 1995, abandoned.

FIELD OF THE INVENTION

This invention generally relates to infrared or thermal imaging systems, and more specifically to the optical coating of a thermal (infrared) detector array, or hybrid uncooled focal plane array (UFPA).

BACKGROUND OF THE INVENTION

Infrared or thermal imaging systems typically use thermal sensors to detect infrared radiation and produce an image capable of being visualized by the human eye. Some examples of such thermal imaging devices include night vision equipment and law enforcement surveillance equipment.

Several prior art references disclose infrared imaging arrays and methods for producing such arrays. U.S. Pat. No. 4,080,532 issued to Hopper; and U.S. Pat. Nos. 4,745,278 and 4,792,681 issued to Hanson utilize ferroelectric materials for infrared detection. Thermal imaging by means of uncooled sensors is described in a paper entitled *Low-cost Uncooled Focal Plane Array Technology* written by Hanson, Beratan, Owen and Sweetser presented Aug. 17, 1993 at the IRIS Detector Specialty Review.

SUMMARY OF THE INVENTION

The present invention is a method for fabricating a hybrid thermal detector structure, comprising the steps of reticulating at least three pixels in a thermally sensitive dielectric, depositing an electrically conductive layer on a first side of the pixels, depositing a precursor film on the electrically conductive layer, gelling the precursor film to form a porous film, attaching electrical contacts to a second side of the pixels, and coupling the electrical contacts to a sensing integrated circuit structure. Radiation may be absorbable by the porous film.

The present invention also entails a hybrid thermal detector structure, comprising an infrared sensing array comprising at least three thermally sensitive pixels, backside contacts abutting one side of the pixels, and an optical coating in contact with an opposite side of the pixels, the optical coating comprised of a porous film; and a sensing integrated circuit structure comprised of interconnect metal coupled at one end to an thermal isolation structure, and integrated circuitry coupled to the other end of the interconnect metal; where the electrical contacts of the infrared sensing array coupled to the interconnect metal of the sensing integrated circuit structure.

Advantages of the invention include improved MTF (Modulation Transfer Function) and improved image acuity of the hybrid thermal detector. A layer of the optical coating may be eliminated with the present invention. The need to reticulate the optical coating may be eliminated. The invention also allows thinner, more responsive devices due to reduced parasitic thermal mass of the porous optical coating.

BRIEF DESCRIPTION OF THE DRAWINGS

In the drawings, which form an integral part of the specification and are to be read in conjunction therewith, and in which like numerals and symbols are employed to designate similar components in various views unless otherwise indicated.

Figure 1:
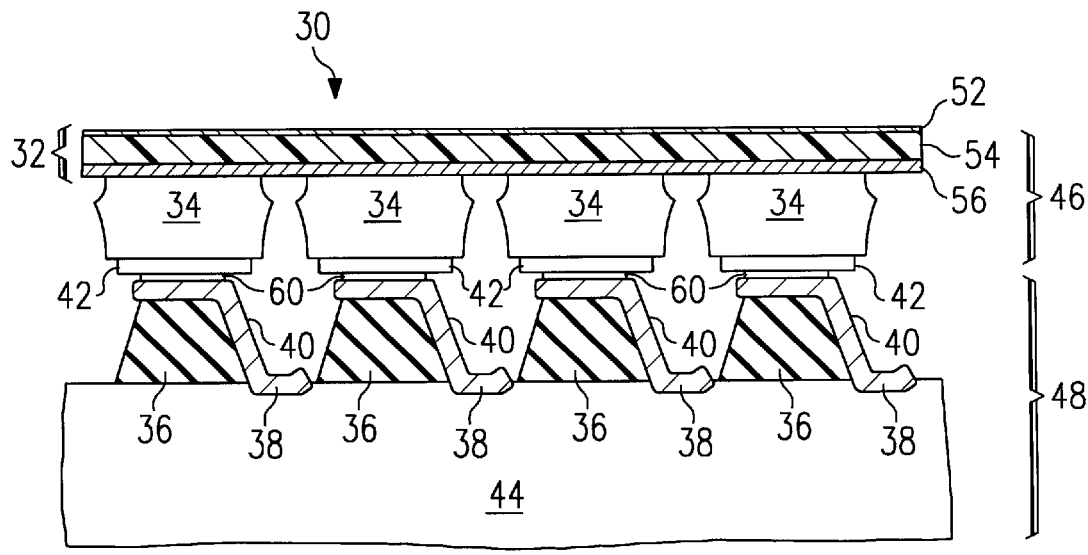
FIG. 1 illustrates the generic concept of a hybrid structure of the prior art consisting of a planar infrared sensing array electrically and physically bonded to thermal isolation structures on a sensing integrated circuit.

The drawings are neither to absolute nor relative scale. Thin film thicknesses have been exaggerated for clarity in description.

DETAILED DESCRIPTION OF THE PREFERRED EMBODIMENTS

Thermal imaging systems described in prior art references utilize an array of ferroelectlic or bolometric sensors to detect thermal images which may then be converted into a visual, for example, TV image. Each pixel (or resistor, when bolometric sensors are used) in these arrays comprises a pyroelectric capacitor having a temperature-sensitive polarization. Since the charge stored by a capacitor is a function of its terminal voltage and capacitance, electronic circuitry may be attached to the two terminals of the pixel capacitor to measure the intensity of the infrared radiation impinging on a specific pixel. Obstructions in the imaging field are removed and electronic connections to these capacitors are simplified if one of these capacitor terminals is common to all. From hundreds to hundreds of thousands of connections are made between the other isolated terminals of the capacitors and the integrated circuit used for electronic sensing. In addition, the pixel capacitors are thermally isolated from each other while having one terminal electrically connected to all the other common terminals.

The common connection, or common electrode, to one side of the pixel capacitors may be part of an optical coating comprised of a plurality of thin films having the desired physical properties, such as infrared transparency, electrical conductivity, and thermal conductivity, for example. The infrared energy is absorbed by the optical coating and is transferred to the pixels which may be made, for example, of barium strontium titanate (BST). The electrical polarization and capacitance of a pyroelectric material such as BST changes in response to temperature.

Typically, an infrared absorber and common electrode assembly are disposed on one side of the pyroelectric element and comprise an optical coating disposed over a common electrode. A sensor signal electrode may be disposed on the opposite side of each pyroelectric element. The infrared absorber and common electrode assembly typically extend across the surface of the focal plane array and electrically couple each pyroelectric element through the common electrode. Each infrared detector element or thermal sensor is defined, in part, by a portion of the infrared absorber and a common electrode assembly and a respective sensor signal electrode, which constitute capacitive plates, and a pyroelectric element, which constitutes a dielectric or insulator disposed between the capacitive plates.

To maximize thermal response and enhance thermal image accuracy, each pyroelectric element of a focal plane array is preferably isolated thermally from adjoining pyroelectric elements so that the sensor signal accurately represents incident infrared radiation associated with each thermal sensor. When the uncooled IR hybrid structure is in use, the temperature of the pixel is modulated by chopping incident IR radiation. This temperature is sensed as a voltage by the readout IC. For optimum operating performance, it is also important to thermally isolate the pyroelectric elements from the sensing integrated circuitry.

The making and use of the presently preferred embodiments are discussed below in detail. However, it should be appreciated that the present invention provides many applicable inventive concepts which can be embodied in a wide variety of specific contexts. The specific embodiments discussed are merely illustrative of specific ways to make and use the invention, and do not delimit the scope of the invention.

The following is a description of a preferred embodiment and manufacturing method of the present invention. Table 1 below provides an overview of the elements of the embodiments and the drawings. The present invention and its advantages are best understood by referring to FIGS. 2–6 and Table 1 with like numbers being used for like and corresponding parts in the drawings.

TABLE 1

| Drawing Element | Generic Term | Preferred or Specific Examples | Other Alternate Examples or Descriptions |
|---|---|---|---|
| 30 | Hybrid Structure | | Hybrid device; hybrid system |
| 32 | Optical coating | Multilayered | |
| 34 | Pixels | Barium strontium titanate | Thermally sensitive dielectric; pixel dielectric; pyroelectric |
| 36 | Thermal isolation structures | Photosensitive polyimide, Dupont 2734 | Thermal isolation mesa; PMMA (polymethylmethacrylate) |
| 38 | Integrated circuit via for sensing circuit | | |
| 40 | Interconnect metal | Metals or Alloys such as TiW or NiCr. | Conductive Oxides |
| 42 | Infrared pixel electrical contact | NiCr | Metals or alloys such as TiW, Au; 4 layer composite of: In 0.5–6 μm Au 0.01–0.5 μm NiCr 0.01–0.5 μm TiW 0.01–0.5 μm |
| 44 | Integrated circuitry | Silicon technology | IR Sensing IC, Sensing integrated circuit, GaAs, readout IC |
| 46 | Infrared sensing array | Optical Coating 32, Pixels 34, Backside contact 42 | Infrared imaging array |
| 48 | Sensing integrated circuit structure | Thermal isolation structures 36, interconnect metal 40, integrated circuitry 44 | |
| 52 | Infrared transparent layer of the optical coating 32. | NiCr (50 Å) | 25–5000 Å of Cermet (Cr-SiO); 25–5000 Å of Lanthanum Strontium Cobalt Oxide (LSCO) |
| 54 | ¼ wavelength separator layer of 32 | PARYLENE (1.4 μm) | ¼ wavelength at desired infrared signal; polyimide reflector; 500–2000 Å; common electrode; cermet; alloys such as Ti/W; conductive oxides such as LSCO. |
| 56 | Electrically conductive layer of 32 | NiCr (1000 Å) | |
| 60 | Bonding material | Indium alloy | PbSn alloy |
| 62 | Precursor film | Silica precursor film | Organometallic silicate solution; a liquid that will gel to form a SiO$_2$ or SiC xerogel or aerogel |

TABLE 1-continued

| Drawing Element | Generic Term | Preferred or Specific Examples | Other Alternate Examples or Descriptions |
|---|---|---|---|
| 64 | Porous film | Silicon dioxide-based xerogel | Silicon dioxide-based aerogel; silicon carbide-based aerogel or xerogel; other aerogels or xerogels; preferably >80% porosity |
| 66 | Temporary filler | Organic | |

While many different geometries and configurations have been described in the references, FIG. 1 shows a prior art drawing of a generic hybrid structure 30 comprised of an infrared sensing array 46 electrically and physically bonded to a sensing integrated circuit structure 48. The electrical and physical mounting of infrared sensing array 46 to sensing integrated circuit structure 48 is achieved by the use of a bonding material 60 to adhere the infrared backside pixel contacts 42 with the interconnect metal 40 through the vias 38.

There are several problems with the prior art structure depicted in FIG. 1. The optical coating 32 is comprised of an infrared transparent layer 52, a ¼ wavelength filter material 54 and an electrically conductive layer 56. The ¼ wavelength filter material 54 of the past comprised an organic such as PARYLENE or polyimide. Such materials do not adequately thermally isolate pixels from each other, resulting in degraded image acuity and MTF. Most optical coatings of the past have comprised three or more layers.

The present invention includes two embodiments having different approaches of using a porous film for the optical coating. The first embodiment is the "black gold" approach, where the porous film absorbs radiation and the infrared transparent layer of the optical coating may be eliminated. In the second embodiment, the porous film acts as a ¼ wavelength separator material.

Figure 2:
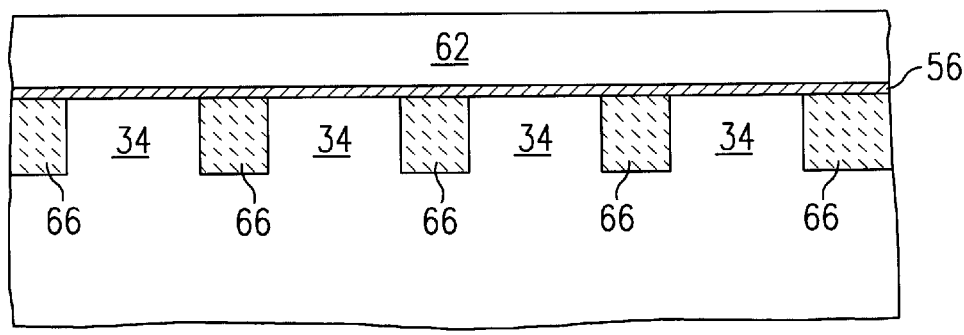
FIGS. 2–6 are cross-sectional views of preferred embodiments of the present invention.
Figure 3:
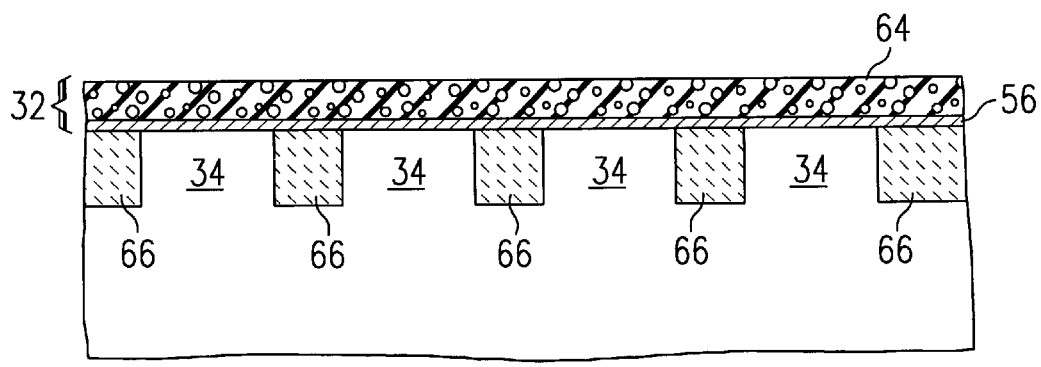
Figure 4:
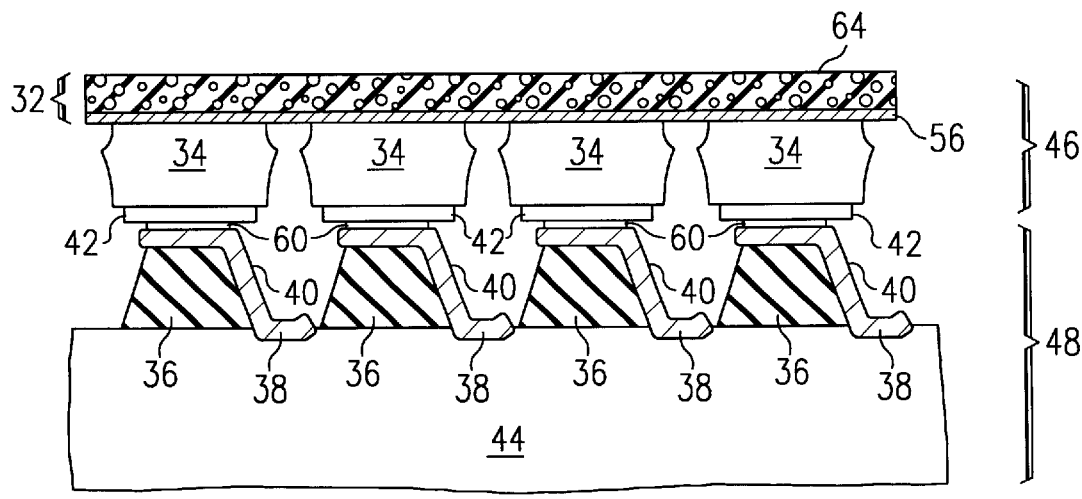

A first embodiment of the present invention is shown in FIGS. 2–4. FIG. 2 shows a slab of barium strontium titanite, for example, which has been reticulated to form pixels 34. A temporary filler 66 comprising an organic, for example, is deposited in the grooves between the pixels 34. Electrically conductive layer 56 is deposited over the tops of the pixels 34 and the temporary filler 66. A precursor film 62 is deposited over the electrically conductive layer 56. The precursor film 62 is preferably an organometallic silicate solution which may be gelled into a silicon-dioxide based xerogel. The precursor film 62 may also comprise liquids that will gel to form silicon dioxide-based aerogel, silicon carbide aerogel or xerogel, or other aerogels or xerogels. The precursor film 62 is liquid and is very planar when applied, as shown in FIG. 2.

The precursor film 62 is gelled to form a porous film 64 as shown in FIG. 3. The precursor film 62 may be gelled by superclitical or non-supercritical drying. Preferably, the resulting porous film 64 is greater than 80% porous. However, the porous film 64 may also be less than or equal to 80% porous, if the mechanical strength of the resulting porous film 64 is sufficient enough to provide structural support to the hybrid structure 30.

The porous film 64 is mounted to a carrier (e.g. mounted with wax to a glass carrier), not shown, and then the excess barium strontium titanate is ground away to leave separate pixels 34. The infrared pixel electrical contacts 42 are attached to the pixels 34, and the temporary filler 66 is removed to complete the assembly of the infrared sensing array 46.

The infrared sensing array 46 is then bonded to the sensing integrated circuit structure 48 with the use of a bonding material 60 applied between the infrared pixel electrical contacts 42 and the interconnect metal 40, as illustrated in FIG. 4, to form the completed hybrid structure 30.

Figure 5:
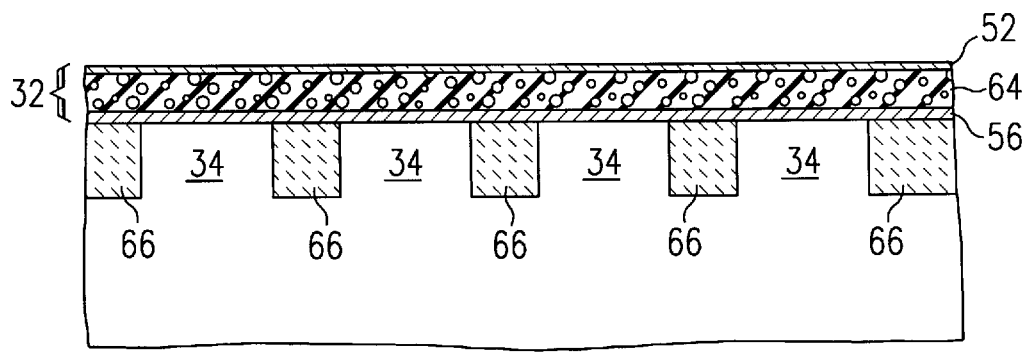
Figure 6:
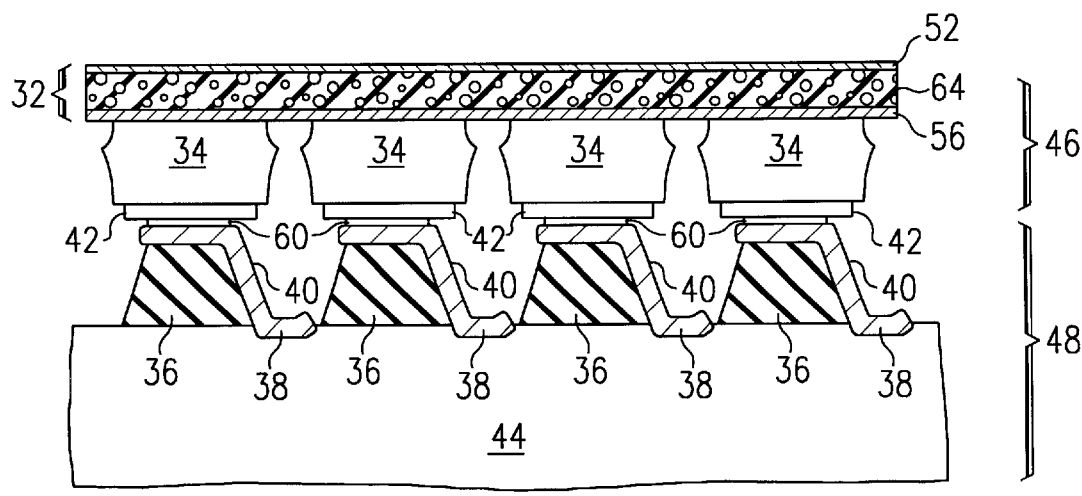

A second embodiment of the present invention is shown in FIGS. 5 and 6. In this embodiment, an infrared transparent layer 52 is deposited on the porous film 64 as shown in FIG. 5. Then the carrier is attached to the infrared transparent layer 52, the excess BST is ground away, the infrared pixel electrical contacts 42 are attached, and the temporary filler 66 is removed. The completed infrared sensing array 46 is then bonded to the sensing integrated circuit structure 48, as shown in FIG. 6.

The porous film 64 of the present invention functions in a different way for each of the first and second embodiments. The first embodiment is the "black gold" approach, where the porous film 64 of the optical coating 32 absorbs the infrared radiation impinging on the detector. The microstructure or porosity of the porous film 64 may be controlled so that the desired wavelength of radiation is absorbed and then converted to heat which is transferred to the pixels. Rather than functioning as a ¼ wavelength spacer or cavity material, the porous film 64 has very small channels of interconnected porosity. When light travels through the channels, it bounces off of the pore walls and small corridors until eventually all of the radiation gets absorbed. The electrically conductive layer 56 also acts as a reflector of the radiation entering the optical coating.

However, in the second embodiment, the porous film 64 acts as a ¼ wavelength separator material, in the same fashion that parylene or polyimide functioned as ¼ wavelength separator material 52 of the prior art. The thickness of the porous film 64 is determined by calculating:

the desired wavelength/4×[the effective index of refraction of the material]$^{-1}$ For example, the desired wavelength to be absorbed could be in the range of 8–14 microns. In the second embodiment, the electrically conductive layer 56 of the optical coating does not absorb the radiation, but rather, the radiation is absorbed by the resonant cavity defined by the reflector (or electrically conductive layer) 56, porous film 64, and IR transparent layer 52. The optical coating of the second embodiment preferably includes a top layer (IR transparent layer 52).

There are many alternates to the hybrid structure illustrated. Various materials and methods of manufacturing are possible, as will be familiar to persons skilled in the art. The porous layer may comprise other suitable aerogels or xerogels. Although not required, the optical coating may be reticulated.

The novel invention of an optical coating having a porous film has many advantages over the prior art. Thermal isolation between the pixels 34 is improved because silica xerogels and aerogels are better thermal insulators than the organic materials used for optical coatings in the past. The improved thermal isolation may result in eliminating the need to reticulate the optical coating. Also, improved thermal isolation between pixels results in better acuity of the image produced by the hybrid structure, and may permit the use of thinner pixels. In the future, thinner pixels may be utilized for hybrid infrared detectors. The use of the porous film of this invention for the optical coating provides increased thermal isolation and allows use of thinner pixels (although the interconnect metal material may need to be changed to a metal having a larger thermal resistance). Thinner pixels will require an optical coating having lower thermal mass. An advantage of the "black gold" approach described in the first embodiment includes eliminating the infrared transparent layer 52. The invention also allows thinner, more responsive devices due to reduced parasitic thermal mass of the porous optical coating.

While the invention has been described with reference to illustrative embodiments, this description is not intended to be construed in a limiting sense. Various modifications and combinations of the illustrative embodiments, as well as other embodiments of the inventions, will be apparent of persons skilled in the art upon reference to the description. It is therefore intended that the appended claims encompass any such modifications or embodiments.

What is claimed is:

1. A method for fabricating a hybrid thermal detector structure, comprising the steps of:

reticulating at least three pixels in a pyroelectric material;

depositing an electrically conductive layer on a first side of said pixels;

depositing a precursor film on said electrically conductive layer;

gelling said precursor film to form a porous film;

attaching electrical contacts to a second side of said pixels; and coupling said electrical contacts to a sensing integrated circuit structure.

2. The method of claim 1 wherein said porous film is a xerogel.

3. The method of claim 2 wherein said xerogel comprises silicon.

4. The method of claim 1 wherein said porous film is an aerogel.

5. The method of claim 4 wherein said aerogel comprises silicon.

6. The method of claim 1 wherein said sensing integrated circuit structure comprises;

interconnect metal coupled at one end to the top of a thermal isolation structure;

and integrated circuitry coupled to the opposite end of said interconnect metal.

7. The method of claim 1 further comprising depositing an infrared transparent layer on said porous film, after said gelling a precursor film.

8. The method of claim 1 wherein radiation is absorbable by said porous film.

9. A method for fabricating a hybrid thermal detector structure, comprising the steps of:

reticulating at least three pixels in a pyroelectric material depositing an electrically conductive layer on a first side of said pixels;

depositing a precursor film on said electrically conductive layer;

gelling said precursor film to form a porous film;

depositing an infrared transparent layer on said porous film;

attaching electrical contacts to a second side of said pixels; and coupling said electrical contacts to a sensing integrated circuit structure.

10. The method of claim 9 wherein radiation is absorbable by said porous film.

11. The method of claim 9 wherein said porous film is a xerogel.

12. The method of claim 11 wherein said xerogel comprises silicon.

13. The method of claim 9 wherein said porous film is an aerogel.

14. The method of claim 13 wherein said aerogel comprises silicon.

15. The method of claim 9 wherein said sensing integrated circuit structure comprises, interconnect metal coupled at one end to the top of a thermal isolation structure;

and integrated circuitry coupled to the opposite end of said interconnect metal.

* * * * *